United States Patent
Igarashi et al.

(10) Patent No.: US 12,201,034 B2
(45) Date of Patent: Jan. 14, 2025

(54) MEMORY DEVICE

(71) Applicant: Kioxia Corporation, Tokyo (JP)

(72) Inventors: Taichi Igarashi, Seoul (KR); Yuichi Ito, Seoul (KR); Eiji Kitagawa, Seoul (KR); Taiga Isoda, Seoul (KR)

(73) Assignee: Kioxia Corporation, Tokyo (JP)

( * ) Notice: Subject to any disclaimer, the term of this patent is extended or adjusted under 35 U.S.C. 154(b) by 462 days.

(21) Appl. No.: 17/550,194

(22) Filed: Dec. 14, 2021

(65) Prior Publication Data

US 2023/0083008 A1    Mar. 16, 2023

(30) Foreign Application Priority Data

Sep. 14, 2021    (JP) ................................. 2021-149447

(51) Int. Cl.
| | | |
|---|---|---|
| *H01L 27/14* | (2006.01) | |
| *H01L 29/82* | (2006.01) | |
| *H10B 61/00* | (2023.01) | |
| *H10N 50/80* | (2023.01) | |
| *H10N 50/85* | (2023.01) | |

(52) U.S. Cl.
CPC ............. *H10N 50/80* (2023.02); *H10B 61/10* (2023.02); *H10N 50/85* (2023.02)

(58) Field of Classification Search
CPC ........ H10B 61/00; H10B 61/20; H10B 63/82; H10B 99/00; H10B 61/10; H10N 50/10; H10N 50/01; H10N 50/85; H10N 50/80
See application file for complete search history.

(56) References Cited

U.S. PATENT DOCUMENTS

| | | |
|---|---|---|
| 9,025,362 B2 | 5/2015 | Higo et al. |
| 9,466,350 B2 | 10/2016 | Murayama et al. |
| 9,583,535 B2 | 2/2017 | Ito |
| 9,608,199 B1 | 3/2017 | Kitagawa |
| 9,647,203 B2 | 5/2017 | Kitagawa et al. |

(Continued)

FOREIGN PATENT DOCUMENTS

| | | |
|---|---|---|
| JP | 4533807 B2 | 9/2010 |
| JP | 2012059906 A | 3/2012 |
| JP | 2020035975 A | 3/2020 |

OTHER PUBLICATIONS

U.S. Appl. No. 17/199,593, First Named Inventor: Kenichi Yoshino; Title: "Magnetic Memory Device and Method for Manufacturing the Same"; Filed: Mar. 12, 2021.

(Continued)

*Primary Examiner* — Niki H Nguyen
(74) *Attorney, Agent, or Firm* — Holtz, Holtz & Volek PC

(57) ABSTRACT

According to one embodiment, a memory device includes a memory cell including a magnetoresistive effect element. The magnetoresistive effect element includes a non-magnetic layer between first and second electrodes in the first direction, a first magnetic layer between the first electrode and the non-magnetic layer, a second magnetic layer between the second electrode and the non-magnetic layer, and a first layer between the second electrode and the second magnetic layer. The first layer includes oxygen and at least one selected from magnesium, transition metal, and lanthanoid, the first layer has a first size in the first direction, the non-magnetic layer has a second size in the first direction. The first size is 1.1 times or more and 2 times or less the second size.

18 Claims, 11 Drawing Sheets

(56) References Cited

U.S. PATENT DOCUMENTS

| | | | |
|---|---|---|---|
| 9,691,968 | B2 | 6/2017 | Ito |
| 9,698,342 | B2 | 7/2017 | Ito |
| 10,026,888 | B2 | 7/2018 | Ochiai et al. |
| 10,128,311 | B2 | 11/2018 | Ito |
| 10,211,256 | B2 | 2/2019 | Kitagawa |
| 10,355,203 | B2 | 7/2019 | Ito |
| 10,381,549 | B2 | 8/2019 | Ito |
| 10,438,997 | B2 | 10/2019 | Wang et al. |
| 10,446,230 | B2 | 10/2019 | Ito |
| 10,573,805 | B2 | 2/2020 | Murayama et al. |
| 10,840,434 | B2 | 11/2020 | Kitagawa et al. |
| 10,854,252 | B2 | 12/2020 | Nagase et al. |
| 10,873,021 | B2 | 12/2020 | Eeh et al. |
| 10,991,407 | B1 * | 4/2021 | Prasad ................ G11C 11/1697 |
| 11,127,445 | B2 | 9/2021 | Eeh et al. |
| 11,133,456 | B2 | 9/2021 | Iwasaki et al. |
| 2006/0021213 | A1 * | 2/2006 | Chang .................... H10N 50/01 257/E27.005 |
| 2007/0014149 | A1 | 1/2007 | Nagamine et al. |
| 2013/0234268 | A1 * | 9/2013 | Kariyada ............... H10N 52/01 257/421 |
| 2015/0263068 | A1 | 9/2015 | Ito |
| 2016/0072049 | A1 * | 3/2016 | Noma .................... G11C 11/161 257/421 |
| 2016/0260773 | A1 | 9/2016 | Kitagawa et al. |
| 2016/0268501 | A1 | 9/2016 | Kitagawa |
| 2016/0284980 | A1 * | 9/2016 | Tonegawa .............. H10N 50/80 |
| 2017/0178705 | A1 * | 6/2017 | Buhrman ............ G11C 11/1697 |
| 2017/0263678 | A1 | 9/2017 | Kitagawa |
| 2017/0263679 | A1 | 9/2017 | Ozeki et al. |
| 2018/0309048 | A1 | 10/2018 | Ochiai et al. |
| 2020/0075671 | A1 | 3/2020 | Ozeki et al. |
| 2020/0083443 | A1 | 3/2020 | Ito et al. |
| 2020/0273510 | A1 * | 8/2020 | Mihajlovic ............ H10N 50/80 |
| 2020/0294567 | A1 | 9/2020 | Oikawa et al. |
| 2020/0302987 | A1 | 9/2020 | Sawada et al. |
| 2021/0074908 | A1 | 3/2021 | Oikawa et al. |
| 2021/0074911 | A1 | 3/2021 | Isoda et al. |
| 2021/0082999 | A1 | 3/2021 | Toko et al. |
| 2021/0083170 | A1 | 3/2021 | Sawada et al. |
| 2021/0287728 | A1 | 9/2021 | Isoda et al. |
| 2021/0287755 | A1 | 9/2021 | Aikawa et al. |
| 2021/0288240 | A1 | 9/2021 | Sawada et al. |

OTHER PUBLICATIONS

U.S. Appl. No. 17/202,151, First Named Inventor: Shogo Itai; Title: "Magnetic Memory Device"; Filed: Mar. 15, 2021.
U.S. Appl. No. 17/389,399, First Named Inventor: Taiga Isoda; Title: "Magnetoresistance Memory Device"; Filed: Jul. 30, 2021.
U.S. Appl. No. 17/465,696, First Named Inventor: Taichi Igarashi; Title: "Magnetoresistance Memory Device and Method of Manufacturing Magnetoresistance Memory Device"; Filed: Sep. 2, 2021.
U.S. Appl. No. 17/471,340, First Named Inventor: Kazuya Sawada; Title: "Magnetic Memory Device"; Filed: Sep. 10, 2021.
U.S. Appl. No. 17/472,056, First Named Inventor: Tadaaki Oikawa; Title: "Magnetic Memory Device"; Filed: Sep. 10, 2021.
U.S. Appl. No. 17/472,131, First Named Inventor: Eiji Kitagawa; Title: "Magnetic Memory Device"; Filed: Sep. 10, 2021.
U.S. Appl. No. 17/472,472, First Named Inventor: Tadaaki Oikawa; Title: "Magnetic Memory Device"; Filed: Sep. 10, 2021.
U.S. Appl. No. 17/546,455, First Named Inventor: Tadaaki Oikawa; Title: "Magnetic Memory Device"; Filed: Dec. 9, 2021.
U.S. Appl. No. 17/549,248, First Named Inventor: Taiga Isoda; Title: "Magnetoresistance Memory Device"; Filed: Dec. 13, 2021.
Cao, et al., "Tuning the Dzyaloshinskii-Moriya Interaction in Pt/Co/MgO heterostructures through MgO thickness", Issue 25, 2018, Nanoscale.

* cited by examiner

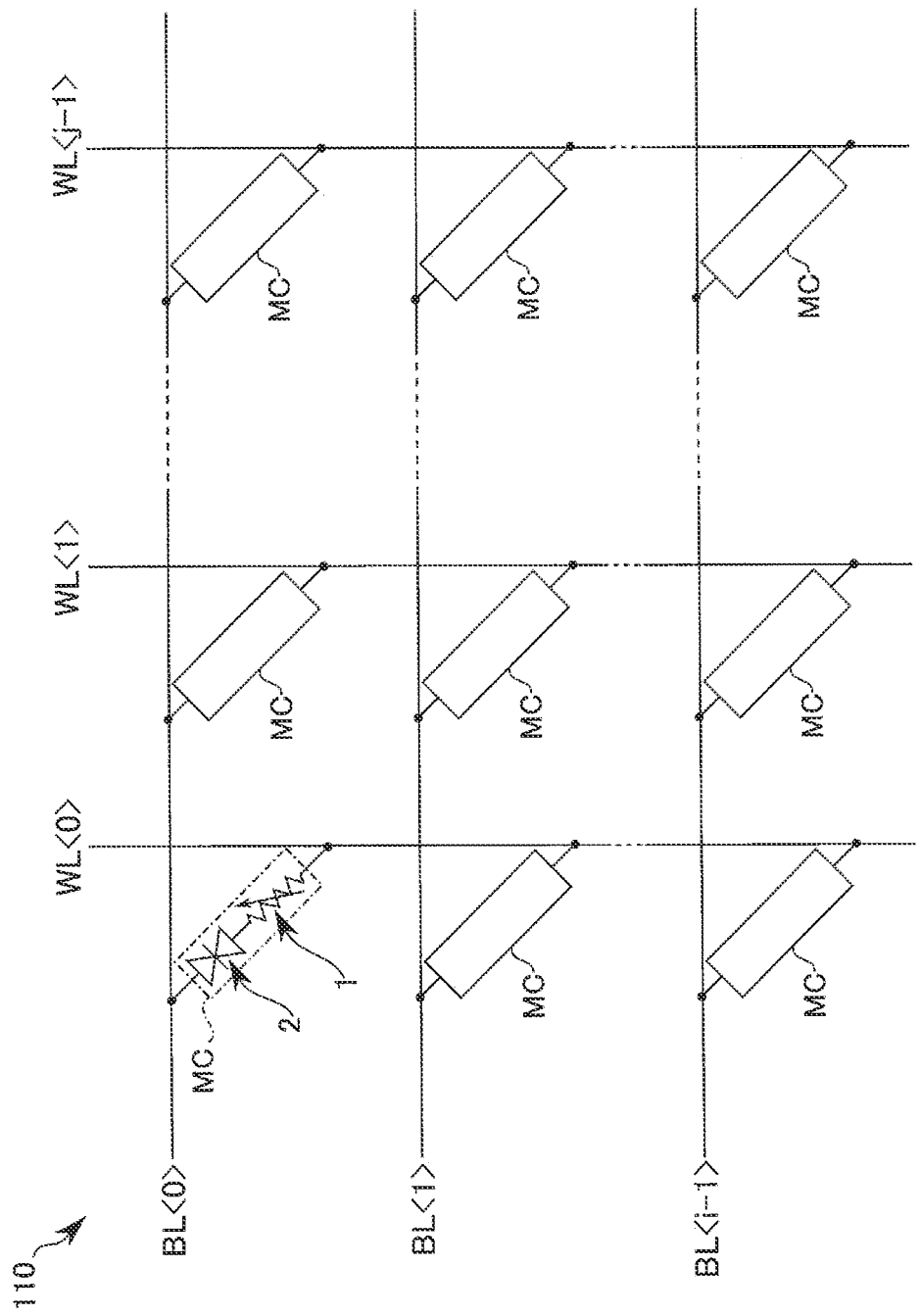
F I G. 2

MEMORY DEVICE

CROSS-REFERENCE TO RELATED APPLICATIONS

This application is based upon and claims the benefit of priority from prior Japanese Patent Application No. 2021-149447, filed Sep. 14, 2021, the entire contents of which are incorporated herein by reference.

FIELD

Embodiments described herein relate generally to a memory device.

BACKGROUND

A memory device in which a variable resistive element (e.g., a magnetoresistive effect element) is used as a memory element is known. To achieve improved device properties, extensive technical research and development are being conducted for such memory devices.

BRIEF DESCRIPTION OF THE DRAWINGS

FIG. 2 is a diagram showing an exemplary configuration of a memory cell array in the memory device according to the first embodiment.

DETAILED DESCRIPTION

The embodiments will be described in detail with reference to the drawings. The description will use the same reference signs for the elements or components having the same or substantially the same functions and configurations.

For each embodiment below, where multiple elements or components of the same type can be involved (e.g., circuits, interconnects, a variety of voltages and signals, and so on), the description may add different numerals or alphabetic letters to the ends of the respective reference signs for discrimination therebetween. If discrimination between elements or components is not required, the description will omit such additional numerals or alphabetic letters (so that the elements, etc. are denoted only by the corresponding reference signs).

In general, according to one embodiment, A memory device includes a first interconnect above a substrate in a first direction, the first direction being perpendicular to a first face of the substrate; a second interconnect between the substrate and the first interconnect; and a memory cell between the first interconnect and the second interconnect, the memory cell including a switching element and a magnetoresistive effect element which are arranged along the first direction. The magnetoresistive effect element includes a first electrode, a second electrode above the first electrode in the first direction, a non-magnetic layer between the first electrode and the second electrode, a first magnetic layer between the first electrode and the non-magnetic layer, a second magnetic layer between the second electrode and the non-magnetic layer, and a first layer between the second electrode and the second magnetic layer. The first layer includes oxygen and at least one selected from magnesium, transition metal, and lanthanoid, the first layer has a first size in the first direction, the non-magnetic layer has a second size in the first direction, wherein the first size is 1.1 times or more and 2 times or less the second size.

EMBODIMENTS

Memory devices according to the embodiments will be described with reference to FIGS. 1 to 11.

(1) First Embodiment

FIGS. 1 to 8 will be referred to for a memory device according to the first embodiment.

[a] Examples of Configurations

Exemplary configurations, etc. associated with the memory device according to the embodiment will be described with reference to FIGS. 1 to 7.

(a-1) Overall Configuration

Figure 1:
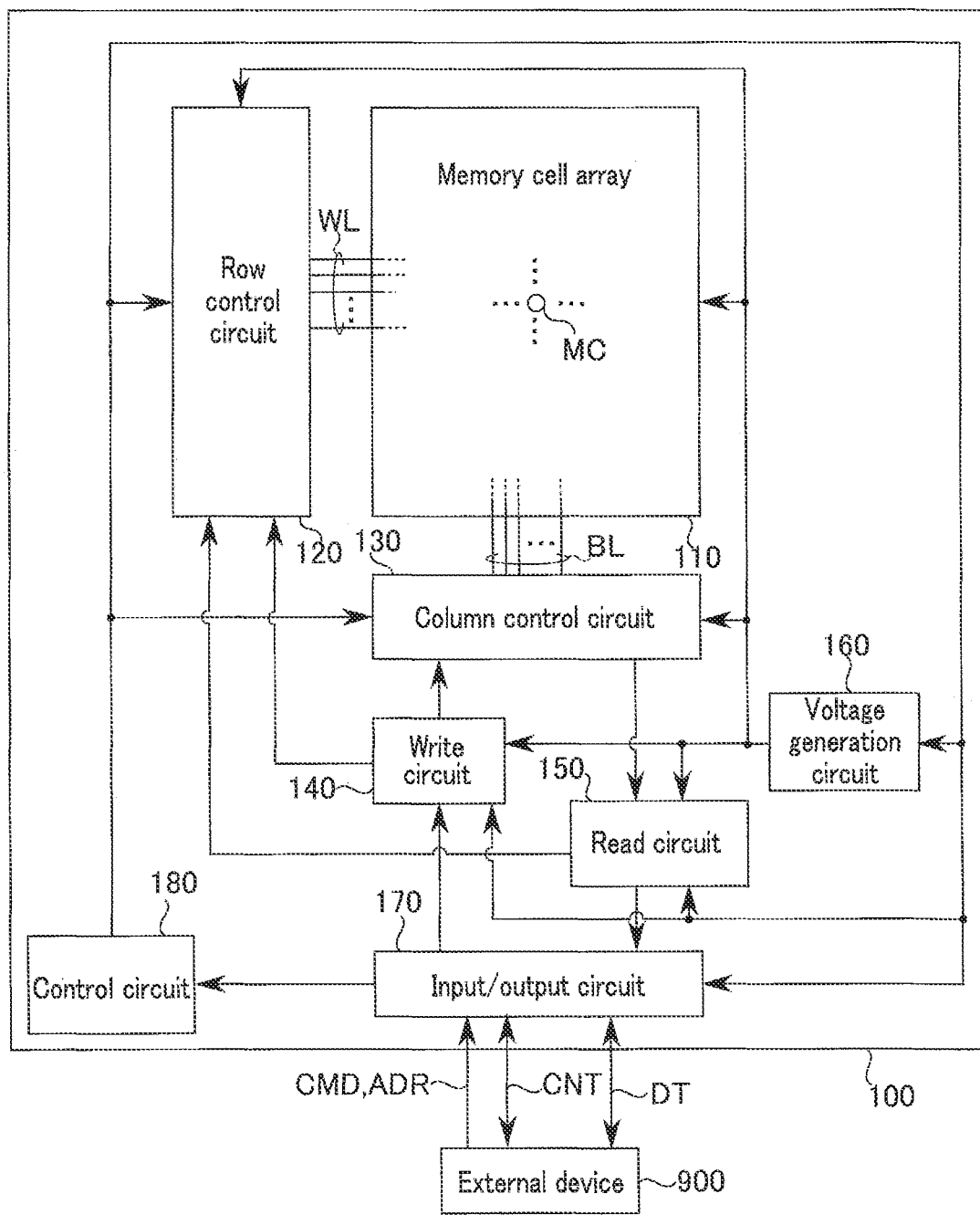
FIG. 1 is a block diagram showing an exemplary configuration of a memory device according to a first embodiment.

FIG. 1 is a diagram showing an exemplary configuration of the memory device according to the present embodiment.

As shown in FIG. 1, the memory device 100 according to this embodiment, denoted by "100", is connected to a device 900 located outside of the memory device 100 (hereinafter, an "external device 900").

The external device 900 sends a command CMD, an address ADR, and a control signal CNT to the memory device 100. Data DT is transferred between the memory device 100 and the external device 900. For write operations, the external device 900 sends data to be written in the memory device 100 (hereinafter, "write data") to the memory device 100. For read operations, the external device 900 receives data read from the memory device 100 (hereinafter, "read data") from the memory device 100.

The memory device 100 according to the present embodiment includes a memory cell array 110, a row control circuit 120, a column control circuit 130, a write circuit 140, a read circuit 150, a voltage generation circuit 160, an input/output circuit 170, and a control circuit 180.

The memory cell array 110 includes multiple memory cells MC, multiple word lines WL, and multiple bit lines BL.

The multiple memory cells MC are each independently associated with corresponding one of multiple rows and corresponding one of multiple columns in the memory cell array 110. Each memory cell MC is connected to corresponding one of the multiple word lines WL. Also, memory cell MC is connected to corresponding one of the multiple bit lines BL.

The row control circuit 120 is connected to the memory cell array 110 via the word lines WL. The row control circuit 120 receives, a row address of the address ADR (or a decoding result for a row address) in the memory cell array 110. The row control circuit 120 controls the multiple word lines WL based on the decoding results for row addresses. The row control circuit 120, in this manner, sets each of the multiple word lines WL (multiple rows) in either a selected state or a non-selected state. Hereinafter, a word line WL set in the selected state will be called a "selected word line WL", and the word lines WL other than the selected word line WL will be called "non-selected word lines WL".

The column control circuit 130 is connected to the memory cell array 110 via the bit lines BL. The column control circuit 130 receives a column address of the address ADR (or a decoding result for a column address) in the memory cell array 110. The column control circuit 130 controls the multiple bit lines BL based on the decoding results for column addresses. The column control circuit 130, in this manner, sets each of the multiple bit lines BL (multiple columns) in either a selected state or a non-selected state. Hereinafter, a bit line BL set in the selected state will be called a "selected bit line BL", and the bit lines BL other than the selected bit line BL will be called "non-selected bit lines BL".

The write circuit 140 writes data in the memory cells MC. The write circuit 140 applies a voltage (or a current) for data write to each of the selected word line WL and the selected bit line BL. Accordingly, selected memory cells MC are supplied with a given write voltage (or a given write current). The write circuit 140 is adapted to supply one of various write voltages to the selected memory cell MC according to the write data. For example, such various write voltages may each have a polarity (a bias direction) according to corresponding write data. In one example, the write circuit 140 includes components such as a write driver (not illustrated) and a write sink (not illustrated).

The read circuit 150 reads data from the memory cells MC. The read circuit 150 amplifies a signal output to the selected bit line BL from the selected memory cell MC. The read circuit 150 specifies data in the memory cell MC based on the amplified signal. In one example, the read circuit 150 includes components such as a preamplifier (not illustrated), a sense amplifier (not illustrated), a read driver (not illustrated), and a read sink (not illustrated).

The voltage generation circuit 160 uses a source voltage from the external device 900 to generate voltages for the memory cell array 110 to perform various operations. In one instance, the voltage generation circuit 160 generates various voltages for use in write operations. The voltage generation circuit 160 outputs generated voltages to the write circuit 140. In another instance, the voltage generation circuit 160 generates various voltages for use in read operations. The voltage generation circuit 160 outputs generated voltages to the read circuit 150.

The input/output circuit 170 functions as an interface circuit between the memory device 100 and the external device 900 for each of the signals including ADR, CMD, CNT, and DT. The input/output circuit 170 passes the address ADR from the external device 900 to the control circuit 180. The input/output circuit 170 passes the command CMD from the external device 900 to the control circuit 180. The input/output circuit 170 allows the control signal CNT, which may be of various contents, to be communicated between the external device 900 and the control circuit 180. The input/output circuit 170 passes write data DT from the external device 900 to the write circuit 140. The input/output circuit 170 passes the data DT from the read circuit 150 as read data to the external device 900.

The control circuit 180 (also called a sequencer, a state machine, or an "internal controller") decodes the command CMD. Based on the result of decoding the command CMD, and also based on the control signal CNT, the control circuit 180 controls operations of the components in the memory device 100, including the row control circuit 120, the column control circuit 130, the write circuit 140, the read circuit 150, the voltage generation circuit 160, and the input/output circuit 170. The control circuit 180 decodes the address ADR. The control circuit 180 sends the result of decoding the address ADR to the row control circuit 120, the column control circuit 130, etc. In one example, the control circuit 180 includes components such as a register circuit (not illustrated) for temporary storage of the command CMD and the address ADR. Note that such a register circuit, a circuit for decoding the command CMD (a command decoder), and a circuit for decoding the address ADR (an address decoder) may be disposed outside the control circuit 180 and within the memory device 100.

(a-2) Memory Cell Array

FIGS. 2 to 5 will be referred to for describing an exemplary configuration, etc. of the memory cell array in the memory device according to the embodiment.

FIG. 2 is an equivalent circuit diagram showing an exemplary configuration of the memory cell array 110 in the memory device 100 according to the embodiment.

As shown in FIG. 2, multiple memory cells MC in the memory cell array 110 are arranged in a matrix pattern. Each memory cell MC is connected to corresponding one of multiple bit lines BL (BL<0>, BL<1>, . . . BL<i−1>) and corresponding one of multiple word lines WL (WL<0>, WL<1>, . . . WL<j−1>). Here, i and j are each an integer equal to or greater than 2.

The memory cells MC each include a memory element 1 and a selector 2.

The memory element 1 is, for example, a variable resistive element. The memory element 1 changes its resistive state to one of multiple resistive states (e.g., a low resistive state and a high resistive state) according to a supplied voltage (or current). The memory element 1 can store data by associating the resistive state of the memory element 1 with data (e.g., data "0" or data "1").

The selector 2 functions as a selecting element for the respective memory cell MC. The selector 2 functions to control the supply of a voltage (or a current) to the corresponding memory element 1 for operations of writing data to this memory element 1 and reading data from this memory element 1.

The selector 2 is, for example, a two-terminal type switching element. In one example, the switching element 2 as the selector 2 is turned off (changes to a high resistive state, where it is electrically non-conductive) when a voltage lower than the threshold voltage of the switching element 2 is applied between the two terminals of the switching element 2. Also, the switching element 2 is turned on (changes to a low resistive state, where it is electrically conductive) when a voltage equal to or higher than the threshold voltage of the switching element 2 is applied between the two terminals of the switching element 2. The two-terminal type switching element may have these functions regardless of the polarity of an applied voltage (e.g., a positive polarity or a negative polarity).

The switching element 2 is adapted to switch between allowing and not allowing a current flow in the corresponding memory cell MC according to the size of the voltage applied to the memory cell MC, regardless of the polarity of this voltage (or the direction of a current flowing in the memory cell MC).

The switching element 2 may include at least one element selected from the group consisting of boron (B), aluminum (Al), gallium (Ga), indium (In), carbon (C), silicon (Si), germanium (Ge), tin (Sn), arsenic (As), phosphorus (P), and antimony (Sb).

Note that the two-terminal type switching element 2 as the selector 2 may include, for example, an insulator including a dopant (an impurity). The dopant added to the insulator is an impurity that contributes to the electrical conduction in the insulator. One example of such an insulator used for the switching element 2 is a silicon oxide. If the material of the switching element 2 is a silicon oxide, the dopant added to the silicon oxide is phosphorus or arsenic. However, types of the dopant added to the silicon oxide of the selector 2 are not limited to this example.

Figure 3:
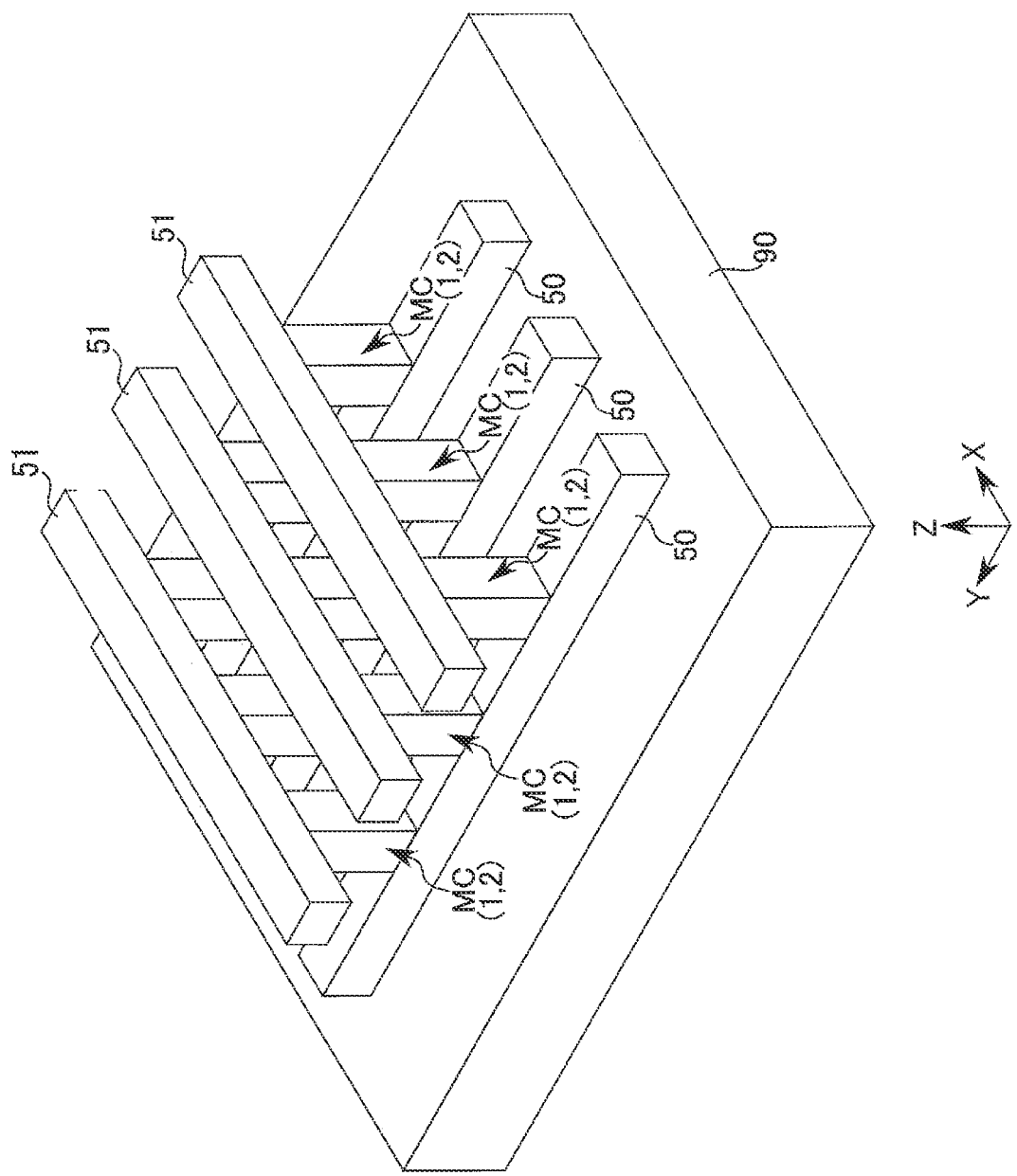
FIG. 3 is an overhead view showing an exemplary structure of the memory cell array in the memory device according to the first embodiment.
Figure 4:
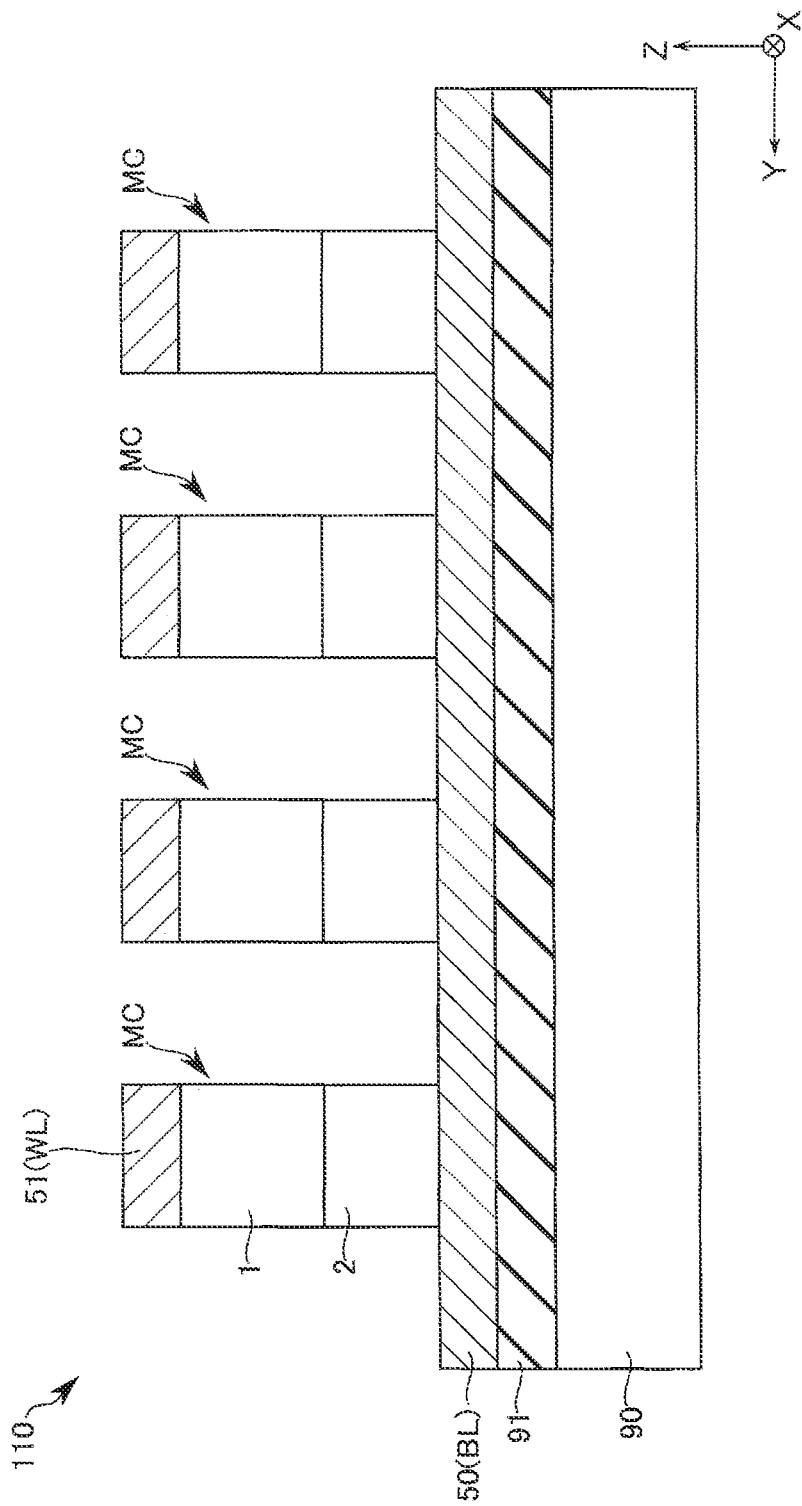
FIG. 4 is a sectional view showing an exemplary structure of the memory cell array in the memory device according to the first embodiment.
Figure 5:
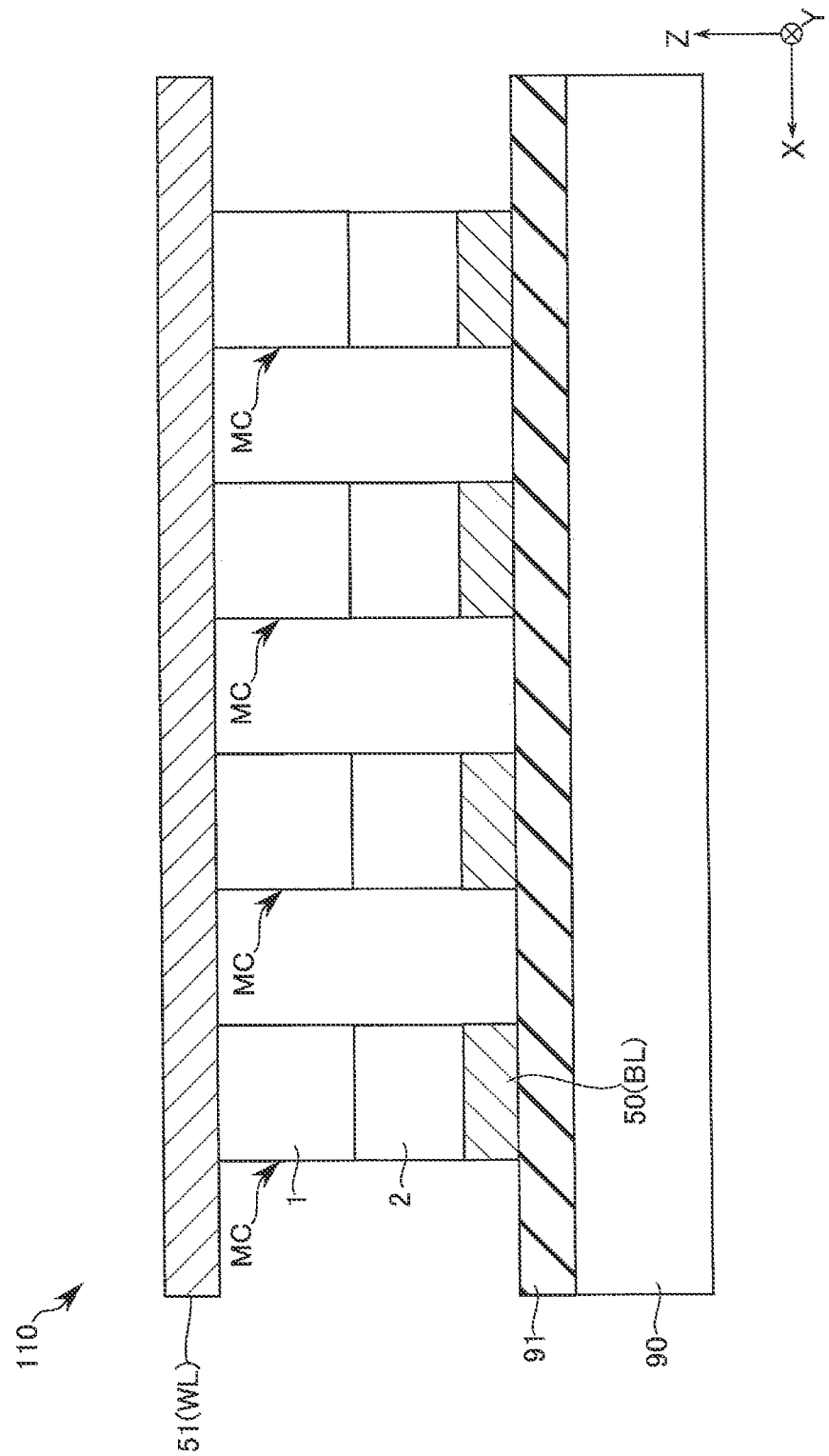
FIG. 5 is a sectional view showing an exemplary structure of the memory cell array in the memory device according to the first embodiment.

FIGS. 3 to 5 are diagrams for explaining exemplary structures of the memory cell array 110 in the memory device 100 according to the embodiment. FIG. 3 is an overhead view for explaining an exemplary structure of the memory cell array 110. FIG. 4 is a schematic sectional view showing a sectional structure of the memory cell array 110, taken along a Y direction (a Y axis). FIG. 5 is a schematic sectional view showing a sectional structure of the memory cell array 110, taken along an X direction (an X axis).

As shown in FIGS. 3 to 5, the memory cell array 110 is provided on the top face of a substrate 90.

The X direction is a direction parallel to the top face of the substrate 90. The Y direction is a direction parallel to the top face of the substrate 90 and orthogonal to the X direction. Hereinafter, a plane parallel to the top face of the substrate 90 will be called an X-Y plane. A direction (an axis) perpendicular to the X-Y plane will be called a Z direction (a Z axis). A plane extending along the X direction and the Z direction will be called an X-Z plane. A plane extending along the Y direction and the Z direction will be called a Y-Z plane.

Multiple interconnects 50 (conductive layers) are provided above the top face of the substrate 90 in the Z direction via an insulation layer 91 on the substrate 90. The interconnects 50 are arranged along the X direction. The interconnects 50 each extend in the Y direction. The interconnects 50 function as, for example, respective bit lines BL.

Multiple interconnects 51 (conductive layers) are provided above the multiple interconnects 50 in the Z direction. The interconnects 51 are arranged along the Y direction. The interconnects 51 each extend in the X direction. The interconnects 51 function as, for example, respective word lines WL.

Multiple memory cells MC are provided between the interconnects 50 and the interconnects 51. The memory cells MC are arranged in a matrix pattern within the X-Y plane.

The memory cells MC arranged along the Y direction are disposed on one interconnect 50 in the Z direction. The memory cells MC arranged along the Y direction are thus connected to the common bit line BL.

The memory cells MC arranged along the X direction are disposed under one interconnect 51 in the Z direction. The memory cells MC arranged along the X direction are thus connected to the common word line WL.

There is a space having a given size in the Y direction (a Y-direction interval) between two memory cells MC arranged in the Y direction. Also, there is a space having a given size in the X direction (an X-direction interval) between two memory cells MC arranged in the X direction. The Y-direction interval between the memory cells MC is substantially the same as the X-direction interval between the memory cells MC. However, the Y-direction interval between the memory cells MC may differ from the X-direction interval between the memory cells MC.

In one example where the memory cell array 110 has a circuit configuration as shown in FIG. 2, each selector 2 is provided below the corresponding memory element 1 in the Z direction. The selector 2 here is arranged between the memory element 1 and the interconnect 50. The memory element 1 is arranged between the interconnect 51 and the selector 2.

As such, each memory cell MC is constituted as a stack of the memory element 1 and the selector 2. With such memory cells MC, the memory cell array 110 has a stack type structure.

Note that the memory cells MC may have a tapered sectional shape according to the processes (e.g., an etching method) adopted for forming the memory cell array 110.

FIGS. 4 and 5 assume an example where the insulation layer 91 is disposed between the multiple interconnects 50 and the substrate 90. If the substrate 90 is a semiconductor substrate, one or more field-effect transistors (not illustrated) may be provided on one or more semiconductor regions of the top face of the substrate 90. The field-effect transistors are covered by the insulation layer 91. The field-effect transistors on the substrate 90 are circuit components of the row control circuit 120, etc. The field-effect transistors are connected to the memory cell array 110 via contact plugs (not illustrated) and interconnects (not illustrated) formed in the insulation layer 91. Such circuits for controlling the operations of the memory cell array 110 may be provided below the memory cell array 110 in the Z direction. Note that if the substrate 90 is a substrate with an insulating property, the multiple interconnects 50 may be disposed directly on the top face of the substrate 90 without the intervening insulation layer 91.

The stack type memory cell array 110 is not limited to the exemplary circuit configurations and structures shown in FIGS. 2 to 5. The circuit configuration and structure of the memory cell array 110 may be discretionarily modified according to the connections of the memory element 1 and the selector 2 to the corresponding bit line BL and the corresponding word line WL. For example, the memory cell array 110 having a circuit configuration as shown in FIG. 2 may adopt a structure other than the exemplary structures shown in FIGS. 3 to 5. As one example, each selector 2 may be provided above the corresponding memory element 1 in the Z direction. In this case, the interconnects 51 are used as bit lines BL and the interconnects 50 are used as word lines WL.

(a-3) Memory Cell

Figure 6:
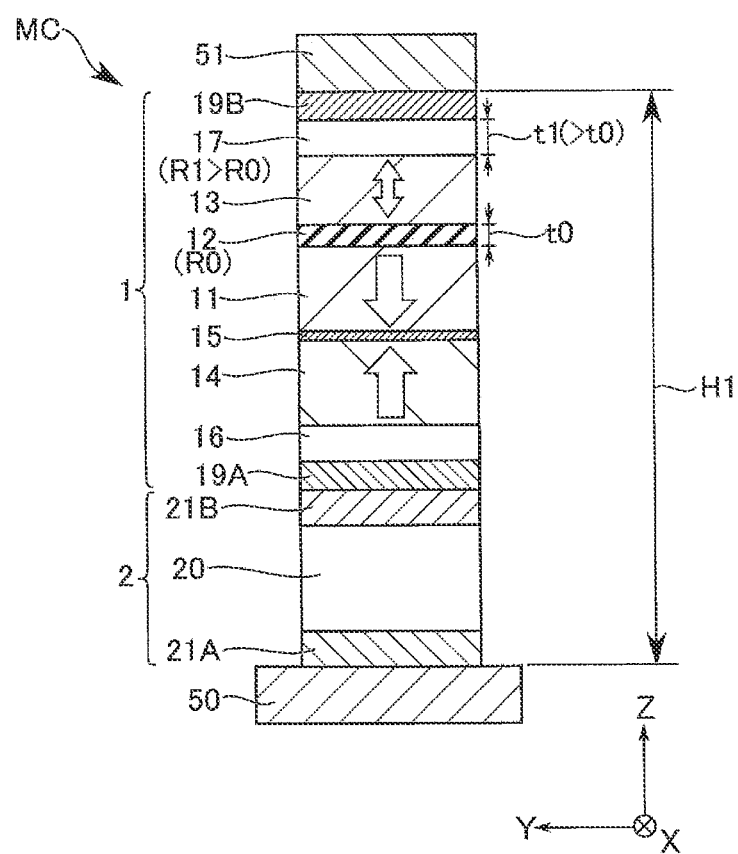
FIG. 6 is a sectional view showing an exemplary structure of a memory cell in the memory device according to the first embodiment.

FIG. 6 is a sectional view schematically showing an exemplary structure of a memory cell MC in the memory device 100 according to the embodiment.

As shown in FIG. 6, in the memory cell MC as a stack, the memory element 1 and the selector 2 are arranged in the Z direction. The memory element 1 is disposed above the selector 2 in the Z direction, as discussed above.

In one exemplary implementation, the variable resistive element serving as the memory element 1 is a magnetoresistive effect element. In such an implementation, the memory device 100 according to the embodiment is a magnetic memory as represented by a magnetoresistive random access memory (MRAM).

<Exemplary Structure of Selector>

The selector 2 may be a two-terminal type switching element as shown in FIG. 6, and in this case, the selector 2 at least includes a variable resistive layer 20 (also called a "selector layer 20" or a "switch layer 20" below) and two electrodes 21A and 21B (conductive layers). The selector layer 20 is provided between the two electrodes 21A and 21B in the Z direction. The selector layer 20 is constituted by, for example, a variable resistive layer. The selector layer 20, as including a variable resistive layer, can take various resistive states (resistance values).

In the example shown in FIG. 6, the electrode 21A (also called a "lower electrode 21A") is arranged below the selector layer 20 in the Z direction, and the electrode 21B (also called an "upper electrode 21B") is arranged above the selector layer 20 in the Z direction. In one example, the electrode 21A is arranged between the interconnect 50 and the selector layer 20. The electrode 21B is arranged between the selector layer 20 and the magnetoresistive effect element 1.

The selector layer 20 is connected to the interconnect 50 via the electrode 21A. Also, the selector layer 20 is connected to the magnetoresistive effect element 1 via the electrode 21B.

The selector layer 20 changes its resistive state to a high resistive state (a non-conductive state) or a low resistive state (a conductive state) according to the voltage applied to the selector 2 (the corresponding memory cell MC). The selector layer 20 being in the high resistive state represents the selector 2 being in an off state. The selector layer 20 being in the low resistive state represents the selector 2 being in an on state.

When the corresponding memory cell MC is set to the selected state, the selector 2 is turned on, and therefore, the selector layer 20 is in the low resistive state. The selector 2 here supplies a voltage (a current) to the memory element 1. When the corresponding memory cell MC is set to the non-selected state, the selector 2 is turned off, and therefore, the selector layer 20 is in the high resistive state. The selector 2 here blocks the supply of a voltage (a current) to the memory element 1.

Note that the changes in the resistive state of the selector layer 20 may be made dependent on a current flowing in the selector 2 (the memory cell MC), e.g., the size of the current, according to the materials of the selector layer 20.

<Exemplary Structure of Magnetoresistive Effect Element>

A magnetoresistive effect element includes two magnetic layers 11 and 13, and a non-magnetic layer 12. The non-magnetic layer 12 is arranged between the two magnetic layers 11 and 13 in the Z direction. In the example shown in FIG. 6, these layers are arranged in the order of the magnetic layer 11, the non-magnetic layer 12, and the magnetic layer 13 along the Z direction from the side of the interconnect 50 (e.g., a bit line) toward the side of the interconnect 51 (e.g., a word line).

The two magnetic layers 11 and 13 and the non-magnetic layer 12 form a magnetic tunnel junction (MTJ). Hereinafter, the magnetoresistive effect element 1 including this MTJ will also be called an "MTJ element 1". The non-magnetic layer 12 in the MTJ element 1 will also be called a "tunnel barrier layer 12".

Examples of the magnetic layers 11 and 13 include a ferromagnetic layer including (containing), for example, cobalt (Co), iron (Fe), boron (B), etc. The magnetic layers 11 and 13 may each be a mono-layer film (e.g., an alloy film) or a multi-layer film (e.g., an artificial lattice film). Examples of the tunnel barrier layer 12 include an insulation layer including (containing) oxygen and magnesium (such as a magnesium oxide layer). The tunnel barrier layer 12 may be a mono-layer film or a multi-layer film. The tunnel barrier layer 12 may additionally contain elements other than oxygen and magnesium.

The present embodiment assumes that the MTJ element 1 is a magnetoresistive effect element of a perpendicular magnetization type.

For example, the magnetic layers 11 and 13 each have a perpendicular magnetic anisotropy. The direction of an easy magnetization axis of the magnetic layers 11 and 13 each is perpendicular to the faces (film surfaces) of the magnetic layers 11 and 13. The magnetic layers 11 and 13 each has magnetization perpendicular to the faces of the magnetic layers 11 and 13. The magnetization direction of each of the magnetic layers 11 and 13 is parallel to the direction (Z direction) in which the magnetic layers 11 and 13 are arranged.

One of the two magnetic layers 11 and 13 has an invariable magnetization direction, while the other has a variable magnetization direction. The MTJ element 1 is adapted to take multiple resistive states (resistance values) according to the relative relationship (magnetization alignment) between the magnetization direction of one magnetic layer and the magnetization direction of the other magnetic layer.

In the example shown in FIG. 6, the magnetization direction of the magnetic layer 13 is variable. The magnetization direction of the magnetic layer 11 is invariable (in a fixed state). Hereinafter, the magnetic layer 13 having a variable magnetization direction will be called a "storage layer 13". The magnetic layer 11 having an invariable (fixed) magnetization direction will be called a "reference layer 11". There are other terms for the storage layer 13, such as a "free layer", a "free magnetization layer", and a "variable magnetization layer". There are other terms for the reference layer 11, such as a "pin layer", a "pinned layer", an "invariable magnetization layer", and a "fixed magnetization layer".

Note that, depending on the circuit configuration of the memory cell array 110, the reference layer may be provided above the tunnel barrier layer 12 in the Z direction and the storage layer may be provided below the tunnel barrier layer 12 in the Z direction.

In the context of this embodiment, an invariable or a fixed-state magnetization direction of the reference layer (one magnetic layer) means that a current or a voltage supplied to the MTJ element 1 for changing the magnetization direction of the storage layer 13 does not entail a change in the magnetization direction of the reference layer 11 before and after the supply of the current or the voltage.

When the magnetization direction of the storage layer 13 conforms to the magnetization direction of the reference layer 11 (namely, when the magnetization alignment state of the MTJ element 1 is a parallel alignment state), the MTJ element is in a first resistive state. When the magnetization direction of the storage layer 13 differs from the magnetization direction of the reference layer 11 (namely, when the magnetization alignment state of the MTJ element 1 is an anti-parallel alignment state), the MTJ element is in a second resistive state different from the first resistive state. The MTJ element 1 in the second resistive state (the anti-parallel alignment state) has a resistance value higher than that of the MTJ element 1 in the first resistive state (the parallel alignment state).

Hereinafter, for the magnetization alignment state of the MTJ element 1, the parallel alignment state may also be called a "P state", and the anti-parallel alignment state may also be called an "AP state".

In one example, the MTJ element 1 includes two electrodes 19A and 19B (conductive layers). The magnetic layers 11 and 13 and the tunnel barrier layer 12 are arranged between the two electrodes 19A and 19B in the Z direction. The reference layer 11 is arranged between the electrode 19A and the tunnel barrier layer 12. The storage layer 13 is arranged between the electrode 19B and the tunnel barrier layer 12.

For exemplary implementation, a shift cancellation layer 14 may be provided within the MTJ element 1. In such implementation, the shift cancellation layer 14 is arranged between the reference layer 11 and the electrode 19A. The shift cancellation layer 14 is a magnetic layer for mitigating the influence of a stray magnetic field from the reference layer 11. When the MTJ element 1 includes the shift cancellation layer 14, a non-magnetic layer 15 is provided between the shift cancellation layer 14 and the reference layer 11. The non-magnetic layer 15 is, for example, a metal layer such as a ruthenium layer. The shift cancellation layer 14 is anti-ferromagnetically bonded to the reference layer 11 via the non-magnetic layer 15. Accordingly, the stack including the reference layer 11 and the shift cancellation layer 14 forms a synthetic anti-ferromagnetic (SAF) structure. In the SAF structure, the shift cancellation layer 14 has a magnetization direction opposite to the magnetization direction of the reference layer 11. The SAP structure contributes to the stable fixation of the magnetization direction of the reference layer 11. Note that the two magnetic layers 11 and 14 and the non-magnetic layer 15, together forming the SAF structure, may be collectively called a "reference layer".

For exemplary implementation, a non-magnetic layer 16 (also called a "base layer 16") may be provided between the shift cancellation layer 14 and the electrode 19A. The base layer 16 is a layer for improving the properties (e.g., crystallinity and magnetic characteristics) of a magnetic layer adjacent to the base layer 16 (in this example, the shift cancellation layer 14).

The base layer 16 is a non-magnetic layer such as a conductive compound layer. Note that the base layer 16 may be handled as a component of the lower electrode 19A.

In the present embodiment, the MTJ element 1 includes a cap layer 17.

The cap layer 17 is arranged between the magnetic layer 13 (the storage layer in this example) and the upper electrode 19B. The cap layer 17 is a non-magnetic layer. The cap layer 17 is a layer for improving the properties (e.g., crystallinity and magnetic characteristics) of a magnetic layer adjacent to the cap layer 17 (in this example, the storage layer 13).

In this embodiment, the cap layer 17 is formed of a material same as the material of the tunnel barrier layer 12. When the material of the tunnel barrier layer 12 includes oxygen and magnesium, the material of the cap layer 17 includes (contains) oxygen and magnesium. When the tunnel barrier layer 12 is a magnesium oxide layer, the cap layer 17 is a magnesium oxide layer. In one example, the magnesium oxide employed as the cap layer 17 has a composition substantially the same as that of the magnesium oxide employed as the tunnel barrier layer 12. However, the composition of the magnesium oxide employed as the cap layer 17 may differ from the composition of the magnesium oxide employed as the tunnel barrier layer 12. Note that, similar to the tunnel barrier layer 12, the cap layer 17 may additionally contain elements other than oxygen and magnesium.

Each memory cell MC has, for example, a size H1 along the Z direction. The size H1 of the memory cell MC is equivalent to the measurement between the top face of the interconnect 50 (or the bottom face of the electrode 21A in the selector 2) and the bottom face of the interconnect 51 (or the top face of the upper electrode 19B in the MTJ element 1).

For the MRAM according to the embodiment, the cap layer 17 is used not only as a layer for improving the properties of the adjacent magnetic layer 13, but also as an internal resistive element (BIR: a built-in resistor) in the memory cell MC.

The cap layer 17 as the internal resistive element (may also be called a "BIR cap layer 17") serves to prevent the memory cell MC from being broken by an overcurrent that could flow in the memory cell MC.

An electric resistance R0 of the tunnel barrier layer 12 and an electric resistance R1 of the cap layer 17 vary according to the thickness t0 of the tunnel barrier layer 12 and the thickness t1 of the cap layer 17, respectively.

In this embodiment, the thickness t1 of the cap layer 17 is larger than the thickness t0 of the tunnel barrier layer 12.

Accordingly, when the tunnel barrier layer 12 and the cap layer 17 are formed of the same material, the electric resistance R1 of the cap layer 17 is higher than the electric resistance R0 of the tunnel barrier layer 12.

As one example, in order for the cap layer 17 to function as an internal resistive element, the electric resistance R1 of the cap layer 17 is preferably equal to or higher than twice the electric resistance R0 of the tunnel barrier layer 12. This allows the MRAM 100 according to the embodiment to suppress the occurrence of an overcurrent flow in each memory cell MC that could break the MTJ element 1 (for example, cause an insulation breakdown of the tunnel barrier layer).

Figure 7:
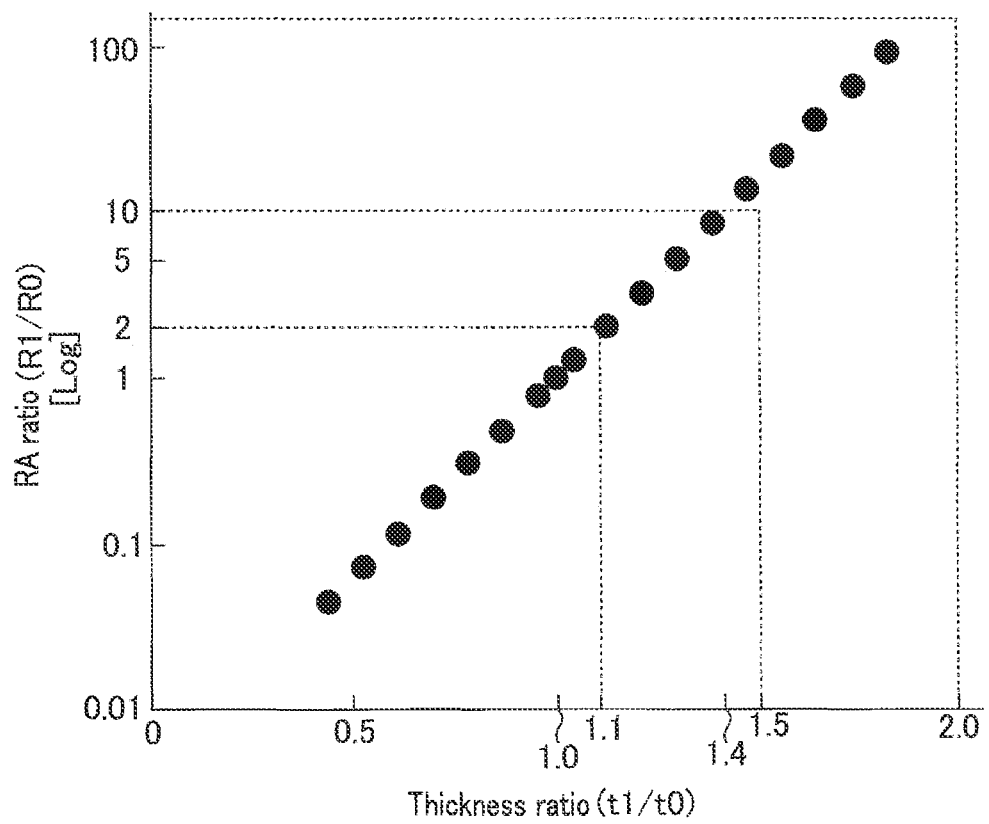
FIG. 7 is a diagram for explaining an example of a memory element in the memory device according to the first embodiment.

FIG. 7 is a graph showing how the thickness ratio between the tunnel barrier layer 12 and the cap layer 17 relates to the resistance ratio between the tunnel barrier layer 12 and the cap layer 17.

In the graph of FIG. 7, the horizontal axis represents a ratio of the thickness t1 of the cap layer 17 to the thickness t0 of the tunnel barrier layer 12 (t1/t0), and the vertical axis represents a ratio of the electric resistance R1 of the cap layer 17 to the electric resistance R0 of the tunnel barrier layer 12 (R1/R0). The vertical axis gives logarithmic scales.

In the present embodiment, the electric resistance R0 of the tunnel barrier layer 12 and the electric resistance R1 of the cap layer 17 are evaluated based on a resistance-area product. A value of the resistance-area product will be called an "RA value".

In the example shown in FIG. 7, the tunnel barrier layer 12 and the cap layer 17 are formed of the same material. Namely, each of the tunnel barrier layer 12 and the cap layer 17 is a magnesium oxide layer.

As shown in FIG. 7, when the ratio of the thickness t1 of the cap layer 17 to the thickness t0 of the tunnel barrier layer 12 (t1/t0) is 1.1, the ratio of the RA value (the electric resistance R1) of the cap layer 17 to the RA value (the electric resistance R0) of the tunnel barrier layer 12 (R1/R0) is approximately 2.

In other words, when the thickness t1 of the cap layer 17 is the thickness t0 of the tunnel barrier layer 12 by 1.1 times, the cap layer 17 can have an RA value R1 twice as high as the RA value R0 of the tunnel barrier layer 12.

For the intended behavior of the memory cell MC, the thickness t1 of the BIR cap layer 17 is set to be 2.0 times or less the thickness t0 of the tunnel barrier layer 12. In this case, the electric resistance R1 of the BIR cap layer 17 is 100 times or less the electric resistance R0 of the tunnel barrier layer 12.

However, in consideration of the voltage or the current supplied to the memory cell MC for write and read operations, and also the load associated with operations of the write circuit 140 and the read circuit 150 (e.g., voltage or current supply capacity), it is desirable that the ratio of the RA value of the BIR cap layer 17 to the RA value of the tunnel barrier layer 12 (R1/R0) be 10 or less. As such, the thickness t1 of the BIR cap layer 17 is more preferably 1.5 times or less the thickness t0 of the tunnel barrier layer 12. In this case, the electric resistance R1 of the BIR cap layer 17 is 10 times or less the electric resistance R0 of the tunnel barrier layer 12. For example, the thickness t1 of the BIR cap layer 17 may be 1.3 times or less, or 1.4 times or less, the thickness t0 of the tunnel barrier layer 12. The electric resistance R1 of the BIR cap layer 17 in either case is 5 times or less the electric resistance R0 of the tunnel barrier layer 12.

Therefore, the cap layer 17 when used as an internal resistive element (a BIR) will not cause an undesirable effect on each operation of the memory cell MC.

There may be an instance where the electric resistance (the RA value) of the cap layer 17 as the internal resistive element becomes more than 100 times the resistance value of the tunnel barrier layer 12 depending on configurations of the memory cell array and the memory cells. In such an instance, the thickness t1 of the BIR cap layer 17 may be set to be larger than twice the thickness t0 of the tunnel barrier layer 12.

The MRAM 100 according to the embodiment may operate based on the known write operations and the known read operations. For example, it performs write operations in such a manner that a voltage or a current is supplied to the word lines WL and the bit lines BL so that a given write current is supplied to each memory cell MC. Also for example, it performs read operations in such a manner that a voltage or a current is supplied to the word lines WL and the bit lines BL so that a given read current is supplied to each memory cell MC.

The MRAM 100 according to the embodiment may be manufactured by the known manufacturing method. The description will therefore omit the method for manufacturing the MRAM 100 according to the embodiment.

However, for the embodiment as described above, the thicknesses t0 and t1 of the respective tunnel barrier layer 12 and cap layer 17 in each MTJ element 1 are controlled so that the thickness t1 of the cap layer 17 is 1.1 times or more (and 2 times or less) the thickness t0 of the tunnel barrier layer 12.

[b] In Sum

A memory device having a stack type memory cell array, such as an MRAM, involves parasitic capacitance with the components (e.g., interconnects) in the memory cell array.

During the period where a selected memory cell is operated, the selector in each non-selected memory cell is in an off state. Interconnects connected to the non-selected memory cells are charged up by the voltage or the current supplied to these interconnects. When a memory cell connected to such a charged-up interconnect is selected as an operation target, a voltage equal to or higher than the threshold voltage (or current) of its selector is applied to the interconnect so as to turn the selector on.

When the selector is turned on, a discharge occurs at the charged-up interconnect. As a result, the memory cell receives the current discharged from the interconnect, in addition to the current intended for the prescribed operation of the memory cell (a write current or a read current).

Hereinafter, a sum of the current intended for operations of the memory cell and the current produced due to discharge will be called an "overshoot current".

An overshoot current flows in a memory cell placed in a selected state. If the overshoot current has a size exceeding the tolerable value of the current for a memory element in the memory cell (e.g., the tunnel barrier layer in the MTJ element), the memory element is broken (e.g., at the tunnel barrier layer).

In consideration of the variations in element characteristics, an internal resistive element may be provided within each memory cell as a measure to prevent the memory cells from being broken due to overshoot currents.

With an internal resistive element in the memory cell, the Z-direction size (height) of the memory cell increases by the Z-direction size of this internal resistive element.

There is a trend to reduce the spaces between neighboring memory cells in a memory cell array for the sake of the improvement of storage density of the memory cell array.

In one example, an aspect ratio of a memory cell in a memory cell array is defined using the height of the memory cell, and the size of the space between neighboring memory cells (the interval between memory cells).

Supposing that the size of each space between neighboring memory cells in a memory cell array is fixed to a given value, a memory cell including an internal resistive element has an aspect ratio greater than that of a memory cell not including an internal resistive element.

Figure 8:
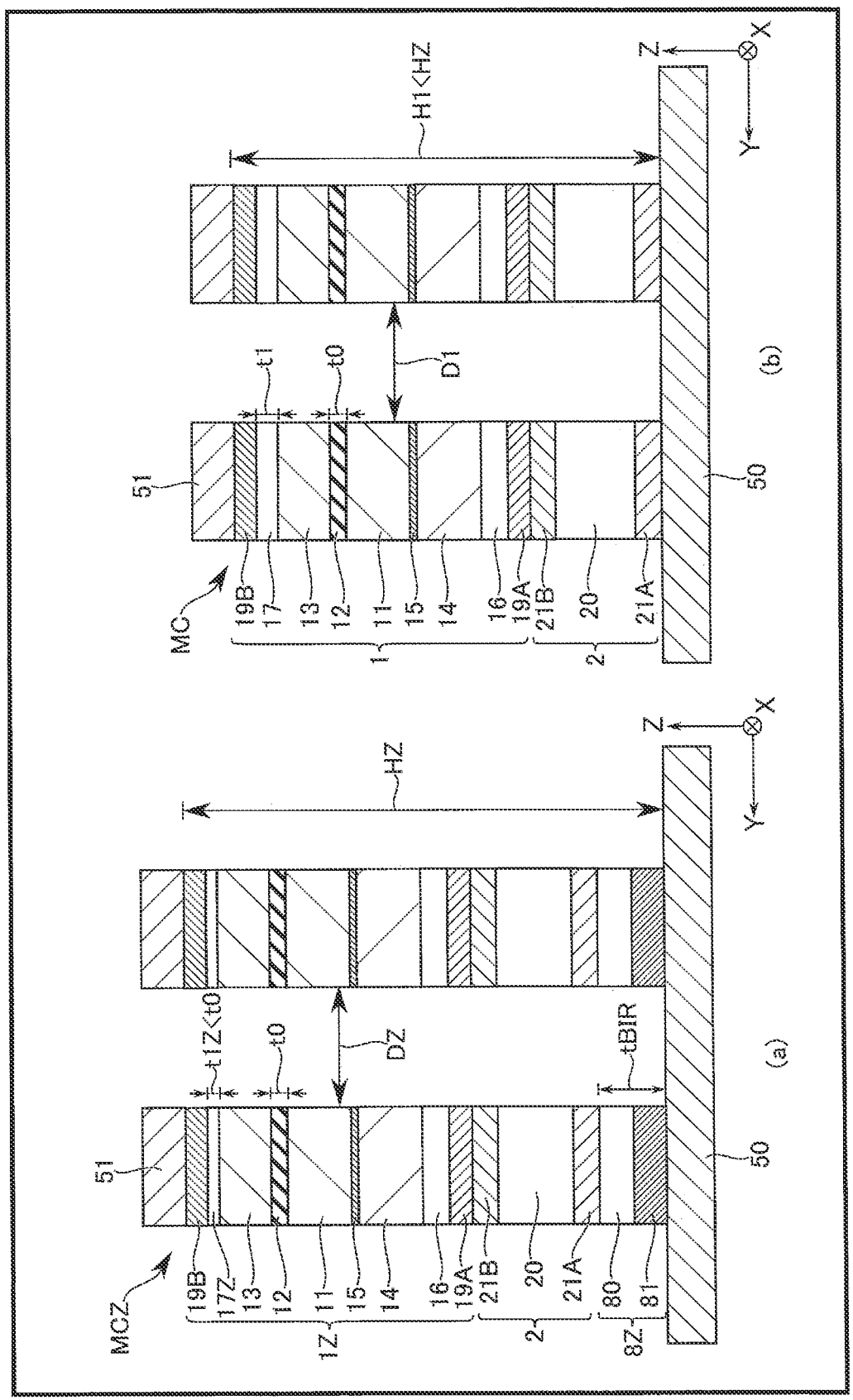
FIG. 8 is a sectional view for explaining a comparative example of the memory device according to the first embodiment.

FIG. 8 is a diagram for explaining a comparative example of the MRAM according to the present embodiment.

(a) of FIG. 8 shows the structure of a memory cell array in an MRAM according to the comparative example. As shown in (a) of FIG. 8, each memory cell MCZ includes an internal resistive element 8Z. The internal resistive element 8Z is an element independent from the MTJ element 1Z and the selector 2. As an exemplary structure, the BIR 8Z includes a resistive layer 80 and at least one electrode 81. The resistive layer 80 (e.g., a layer including at least one of a silicon oxide layer and a silicon nitride layer) is arranged between the interconnect 50 and the electrode 21A of the selector 2. The electrode 81 is arranged between the resistive layer 80 and the interconnect 50. A further electrode (a conductive layer) of the internal resistive element 8Z may be provided between the resistive layer 80 and the electrode 21A.

In the MRAM according to the comparative example shown in (a) of FIG. 8, the cap layer 17Z has a thickness t1Z smaller than the thickness t0 of the tunnel barrier layer 12. For example, the thickness t1Z of the cap layer 17Z is 0.6 times or less the thickness t0 of the tunnel barrier layer 12. Thus, the cap layer 17Z has an electric resistance (an RA value) smaller than that of the tunnel barrier layer 12.

The internal resistive element 8Z has a size tBIR in the Z direction larger than the thickness t0 of the tunnel barrier layer 12. For example, the tBIR is larger than the sum of the thickness t0 and the thickness t1Z. Generally, the size tBIR is set to be sufficiently larger than 1.1 times (or twice) the thickness t0.

Each memory cell MCZ has a Z-direction size "HZ". The space between neighboring memory cells MCZ has a size "DZ". The aspect ratio of the memory cell MCZ is thus "HZ/DZ".

Supposing that this aspect ratio is increased, a margin (a processing margin) that can be provided for the separation space between the memory cells MCZ would decrease. The decreased margin could result in poor separation between the memory cells MCZ, and consequently in the possibility of short-circuiting between neighboring memory cells.

A larger interval may be set between the memory cells MCZ in order to secure the complete separation between neighboring memory cells MCZ. However, this would degrade the storage density of the memory cell array or increase the chip size of the MRAM.

Also, an increase in the aspect ratio of each memory cell MCZ would render the formation of the memory cells MCZ and the memory cell array difficult (for example, by the difficulty of the etching processes).

(b) of FIG. 8 shows the structure of a memory cell array in the MRAM according to the present embodiment.

In the embodiment as discussed above, the cap layer 17 in each memory cell MC functions as an internal resistive element (BIR).

As shown in (b) of FIG. 8, each memory cell MC has a Z-direction size "H1". The space between neighboring memory cells MC has a size (interval) "D1". In the embodiment, the aspect ratio of the memory cell MC is thus "H1/D1".

Even though the thickness t1 of the cap layer 17 is large as compared to the thickness t1Z of the cap layer 17Z of the comparative example, the thickness t1 is about 1.1 to 2 times the thickness t0. Moreover, the embodiment does not employ an internal resistive element independent from the MTJ element 1 and the selector 2 (such as the element 8Z in (a) of FIG. 8).

Therefore, the size H1 of the memory cell MC according to the embodiment is smaller than the size HZ of the memory cell MCZ according to the comparative example.

As such, if the interval D1 in the MRAM according to the embodiment is equal to the interval DZ in the MRAM according to the comparative example, the aspect ratio (H1/D1) of the memory cell MC is smaller than the aspect ratio (HZ/DZ) of the memory cell MCZ.

Accordingly, the MRAM 100 according to the embodiment can suppress both degradation of the memory density of the memory cell array 110 and/or increase in chip size of the MRAM.

As described above, the MRAM 100 according to the embodiment, the cap layer 17 is used as an internal resistive element in the memory cell MC. This enables the MRAM 100 according to the embodiment to prevent the breakdown of the MTJ elements 1 due to the excess overshoot currents.

Also, the MTJ elements 1 are memory elements provided through a fabrication process relatively well-controlled for suppressing the variations in characteristics thereof. Thus, when a cap layer 17 as a member constituting the MTJ element 1 is used as an internal resistive element, the variations in electric resistance which could be entailed among the cap layers 17 as the internal resistive elements are suppressed. Consequently, the MRAM 100 according to the embodiment can suppress the variations in characteristics of the multiple memory cells MC including the respective internal resistive elements in the memory cell array 110.

Moreover, in the structure as in the present embodiment, where a magnesium oxide layer of the tunnel barrier layer 12 and the cap layer 17 adjacent to the storage layer 13 have an increased thickness, the Dzyaloshinskii-Moriya interaction (DMI) in the MTJ element 1 becomes large. As a result, the MRAM 100 according to the embodiment can reduce the size of a magnetization switching threshold current (Ic) in each MTJ element 1.

Therefore, the memory device according to the embodiment can be realized with improved characteristics of a memory device.

(2) Second Embodiment

Figure 9:
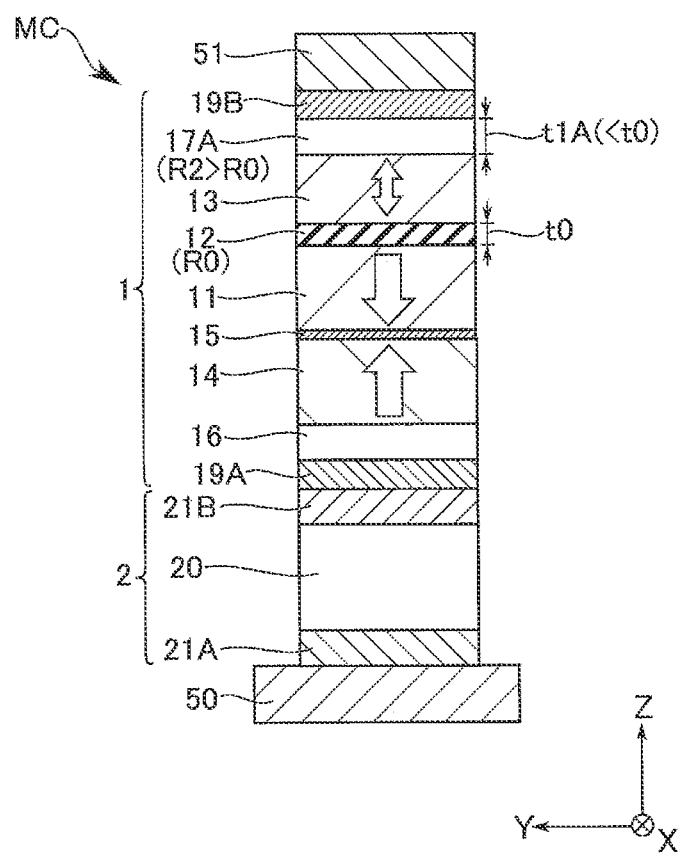
FIG. 9 is a sectional view showing an exemplary structure of a memory cell in a memory device according to a second embodiment.

FIG. 9 will be referred to for describing a memory device according to the second embodiment.

FIG. 9 is a schematic sectional view showing an exemplary structure of a memory cell in the memory device according to the embodiment.

In the memory cell MC shown in FIG. 9, a material of the cap layer 17A is different from the material of the tunnel barrier layer 12.

For example, a metal oxide is used as a material of the cap layer 17A.

The metal oxide used in the cap layer 17A includes at least one selected from tantalum (Ta), cobalt (Co), nickel (Ni), iron (Fe), scandium (Sc), titanium (Ti), vanadium (V), chromium (Cr), manganese (Mn), copper (Cu), zinc (Zn), gallium (Ga), molybdenum (Mo), zirconium (Zr), ruthenium (Ru), niobium (Nb), tungsten (W), hafnium (Hf), lanthanum (La), and lutetium (Lu).

For example, the cap layer 17A is a layer including (containing) transition metal and oxygen, a layer including lanthanoid and oxygen, or a layer including transition metal, lanthanoid, and oxygen. As one example, the cap layer 17A is a transition metal oxide layer or a lanthanoid oxide layer. Note that the cap layer 17A may further contain magnesium in addition to transition metal, lanthanoid, and oxygen.

A transition metal oxide and a lanthanoid oxide have a relatively small bandgap. Meanwhile, a transition metal oxide and a lanthanoid oxide have a lattice constant larger than the lattice constant of a magnesium oxide. Thus, the electric resistance R1A (the RA value) of the cap layer 17A including a transition metal oxide and/or a lanthanoid oxide can be controlled by adjusting the thickness of a transition metal oxide layer and/or lanthanoid oxide layer.

Assuming that the cap layer 17A is a transition metal oxide layer or a lanthanoid oxide layer, thickness t1A of a transition metal oxide layer 17A or a lanthanoid oxide layer 17A is larger than the thickness t0 of the tunnel barrier layer 12 which uses a magnesium oxide. Accordingly, the layer 17A including a transition metal oxide or a lanthanoid oxide functions as an internal resistive element while serving as a cap layer.

According to this embodiment, the thickness t1A of the cap layer 17A including a transition metal oxide or a lanthanoid oxide is 1.1 times or more and 2 times or less (e.g., 1.5 times or less) the thickness t0 of the tunnel barrier layer 12 including a magnesium oxide.

This renders the electric resistance R2 (e.g., the RA value) of the cap layer 17A including a transition metal oxide or a lanthanoid oxide twice or more the electric resistance of the tunnel barrier layer 12. For example, the electric resistance R2 of the cap layer 17A may be 100 times or less, or more preferably 10 times or less, the electric resistance R0 of the tunnel barrier layer 12.

Note that the cap layer 17A functioning as an internal resistive element may use an oxide layer (e.g., a metal oxide layer) using elements other than the exemplary elements mentioned above. Also, the cap layer 17A may take the form of a stacked film in which two or more of a magnesium oxide layer, a transition metal oxide layer, and a lanthanoid oxide layer are stacked in the Z direction.

As described above, the cap layer 17A including a transition metal oxide or a lanthanoid oxide has an electric resistance desired of the internal resistive element.

Therefore, the memory device according to the present embodiment can realize substantially the same advantages as the memory device according to the preceding embodiment.

(3) Third Embodiment

Figure 10:
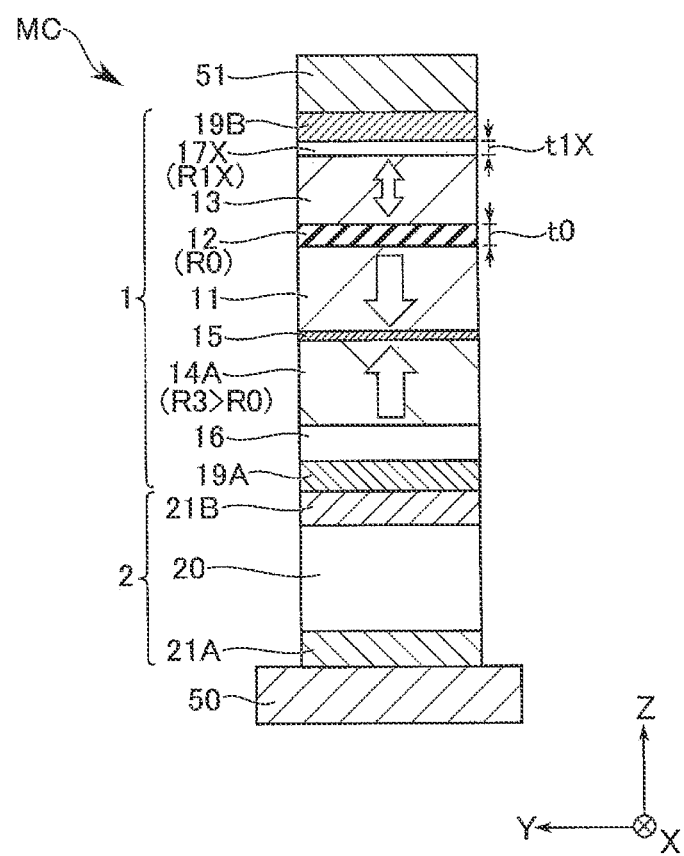
FIG. 10 is a sectional view showing an exemplary structure of a memory cell in a memory device according to a third embodiment.

FIG. 10 will be referred to for describing a memory device according to the third embodiment.

FIG. 10 is a schematic sectional view showing an exemplary structure of a memory cell in the memory device according to the embodiment.

In the memory cell MC shown in FIG. 10, the shift cancellation layer 14A functions as an internal resistive element in a memory cell.

The shift cancellation layer 14A has an electric resistance R3 (e.g., an RA value) higher than the electric resistance R0 of the tunnel barrier layer 12. As discussed above, it is preferable that the electric resistance of an internal resistive element be at least twice as high as the electric resistance R0 of the tunnel barrier layer 12. Thus, the RA value R3 of the shift cancellation layer 14A is set to be, for example, twice or more the RA value R0 of the tunnel barrier layer 12. Also, for example, the RA value R3 of the shift cancellation layer 14A is set to be 100 times or less, or more preferably 10 times or less, the RA value R0 of the tunnel barrier layer 12.

In order for a magnetic layer 14A to maintain the function of the shift cancellation layer while having the RA value R3 higher than the RA value R0 of the tunnel barrier layer 12, the thickness and the material of the shift cancellation layer 14A are adjusted. Here, the thickness and the material of each of the reference layer 11 and the non-magnetic layer 15 may be adjusted together with the thickness and the material of the shift cancellation layer 14A.

In the exemplary structure according to this embodiment, the cap layer 17X has a thickness t1X smaller than the thickness t0 of the tunnel barrier layer 12. Thus, the cap layer 17X has an electric resistance R1X (an RA value) smaller than the electric resistance R0 (the RA value) of the tunnel barrier layer 12.

Note that it is also possible to adopt a structure that uses both the cap layer functioning as an internal resistive element (e.g., the cap layer as in the first or the second embodiment) and the shift cancellation layer 14A functioning as an internal resistive element.

The memory device according to the present embodiment can realize the same advantages as in the preceding embodiments.

(4) Fourth Embodiment

Figure 11:
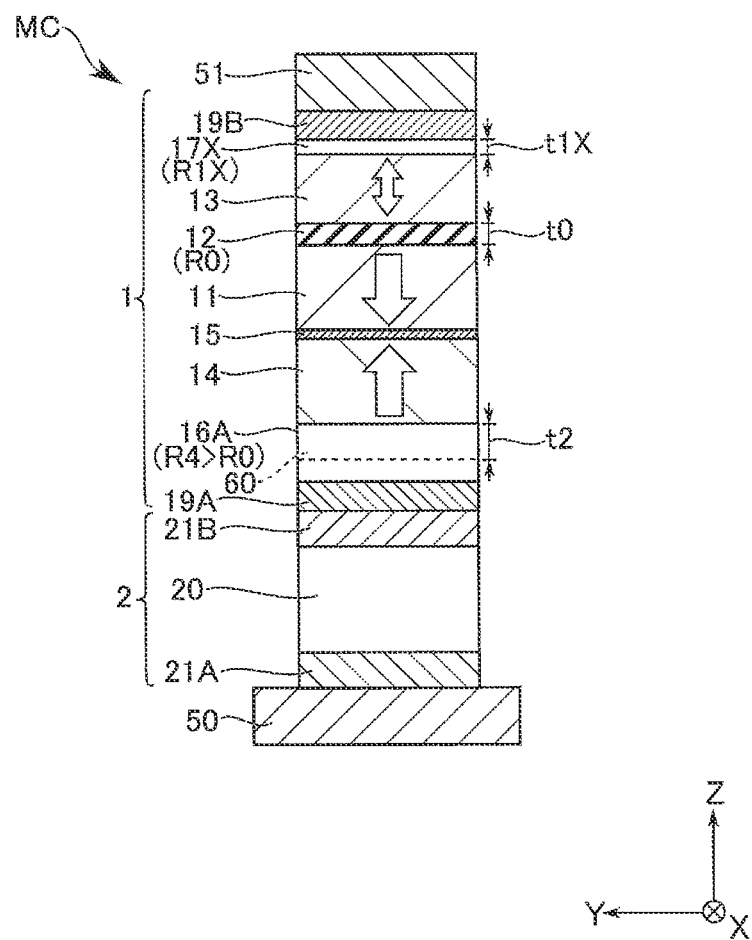
FIG. 11 is a sectional view showing an exemplary structure of a memory cell in a memory device according to a fourth embodiment.

FIG. 11 will be referred to for describing a memory device according to the fourth embodiment.

FIG. 11 is a schematic sectional view showing an exemplary structure of a memory cell in the memory device according to the embodiment.

In the example shown in FIG. 11, the base layer 16A is used as an internal resistive element (BIR).

Here, the base layer 16A has an electric resistance R4 (e.g., an RA value) higher than the electric resistance R0 of the tunnel barrier layer 12. For example, the electric resistance R4 of the base layer 16A is 2 times or more and 100 times or less (more preferably 10 times or less) the electric resistance R0 of the tunnel barrier layer 12.

By controlling the material, thickness, etc. of the base layer 16A, the RA value of the base layer 16A as an internal resistive element (may also be called a "BIR base layer 16A") is set to be higher than the RA value of the tunnel barrier layer 12.

In one example, the BIR base layer 16A includes a layer 60 (may also be called a "resistive layer 60") formed of a material (e.g., a material including oxygen and magnesium) same as that of the tunnel barrier layer 12. The resistive layer 60 (e.g., a magnesium oxide layer) has a thickness t2 larger than the thickness t0 of the tunnel barrier layer 12 (e.g., a magnesium oxide layer). Here, the thickness t2 of the resistive layer 60 is 1.1 times or more and 2.0 times or less (e.g., 1.5 times or less) the thickness t0 of the tunnel barrier layer 12, as shown in FIG. 7 referred to in the foregoing description.

Note that the material of the resistive layer 60 may be a material including transition metal and oxygen (e.g., a transition metal oxide) or a material including lanthanoid and oxygen (e.g., a lanthanoid oxide) as described above. When the resistive layer 60 is a transition metal oxide layer or a lanthanoid oxide layer, the thickness t2 of the resistive layer 60 is 1.1 times or more and 2.0 times or less (e.g., 1.5 times or less) the thickness t0 of the tunnel barrier layer 12.

The base layer 16A in its entirety may be formed of the same material as the tunnel barrier layer 12. Also, the base layer 16A in its entirety may be formed of a transition metal oxide or a lanthanoid oxide.

In this embodiment, the cap layer 17X has a thickness t1X smaller than the thickness t0 of the tunnel barrier layer 12. Thus, the cap layer 17X has an electric resistance (an RA value) smaller than the electric resistance (the RA value) of the tunnel barrier layer 12.

Note that it is also possible to adopt a structure that uses both the cap layer functioning as an internal resistive element (e.g., the cap layer as in the first or the second embodiment) and the base layer 16A functioning as an internal resistive element.

According to the present embodiment where the base layer 16A in the MTJ element 1 functions as an internal resistive element, substantially the same advantages as in the preceding embodiments can be realized.

(5) Others

The description has assumed an MRAM to be an example of the memory device 100 according to each of the above embodiments. However, the memory device 100 according to each embodiment is not limited to an MRAM but may be any memory device that employs a memory cell MC having an internal resistive element for operational stability.

For example, the memory device 100 according to each embodiment may be any one of various types of memory devices including a memory device (a resistive memory such as ReRAM) whose memory element is a variable resistive element (e.g., a transition metal oxide element), a memory device (a phase-change memory such as PCRAM) whose memory element is a phase-change element, and a memory device (a ferroelectric memory such as FeRAM) whose memory element is a ferroelectric element.

The memory device 100 according to each embodiment, even in the form of a memory device other than an MRAM, can likewise realize the advantages as explained in the foregoing description.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A memory device comprising:
a first interconnect above a substrate in a first direction, the first direction being perpendicular to a first face of the substrate;
a second interconnect between the substrate and the first interconnect; and
a memory cell between the first interconnect and the second interconnect, the memory cell including a switching element and a magnetoresistive effect element which are arranged along the first direction,
wherein the magnetoresistive effect element includes
a first electrode,
a second electrode above the first electrode in the first direction,
a non-magnetic layer between the first electrode and the second electrode,
a first magnetic layer between the first electrode and the non-magnetic layer,
a second magnetic layer between the second electrode and the non-magnetic layer, and
a first layer between the second electrode and the second magnetic layer, the first layer including oxygen and at least one selected from magnesium, transition metal, and lanthanoid, and
a first size in the first direction of the first layer falls within a range of 1.1 times or more to 2 times or less than a second size in the first direction of the non-magnetic layer.

2. The memory device according to claim 1, wherein the transition metal includes at least one selected from tantalum, cobalt, nickel, iron, scandium, titanium, vanadium, chromium, manganese, copper, zinc, gallium, molybdenum, zirconium, ruthenium, niobium, tungsten, and hafnium.

3. The memory device according to claim 1, wherein the lanthanoid includes at least one selected from lanthanum and lutetium.

4. The memory device according to claim 1, wherein
the first magnetic layer is a reference layer,
the second magnetic layer is a storage layer, and
the non-magnetic layer is a tunnel barrier layer.

5. The memory device according to claim 1, wherein an electric resistance of the first layer is higher than an electric resistance of the non-magnetic layer.

6. The memory device according to claim 1, wherein
the first magnetic layer has a fixed magnetization direction, and
the second magnetic layer has a variable magnetization direction.

7. The memory device according to claim 1, wherein the non-magnetic layer includes oxygen and magnesium.

8. A memory device comprising:
a first interconnect above a substrate in a first direction, the first direction being perpendicular to a first face of the substrate;
a second interconnect between the substrate and the first interconnect; and
a memory cell between the first interconnect and the second interconnect, the memory cell including a switching element and a magnetoresistive effect element which are arranged along the first direction,
wherein the magnetoresistive effect element includes
a first electrode,
a second electrode above the first electrode in the first direction,
a non-magnetic layer between the first electrode and the second electrode,
a first magnetic layer between the first electrode and the non-magnetic layer,
a second magnetic layer between the second electrode and the non-magnetic layer, and
a first layer between the first electrode and the first magnetic layer, the first layer including oxygen and at least one selected from magnesium, transition metal, and lanthanoid, and
a first size in the first direction of the first layer falls within a range of 1.1 times or more to 2 times or less than a second size in the first direction of the non-magnetic layer.

9. The memory device according to claim 8, wherein the transition metal includes at least one selected from tantalum, cobalt, nickel, iron, scandium, titanium, vanadium, chromium, manganese, copper, zinc, gallium, molybdenum, zirconium, ruthenium, niobium, tungsten, and hafnium.

10. The memory device according to claim 8, wherein the lanthanoid includes at least one selected from lanthanum and lutetium.

11. The memory device according to claim 8, wherein
the first magnetic layer is a reference layer,
the second magnetic layer is a storage layer, and
the non-magnetic layer is a tunnel barrier layer.

12. The memory device according to claim 8, wherein an electric resistance of the first layer is higher than an electric resistance of the non-magnetic layer.

13. The memory device according to claim 8, wherein
the first magnetic layer has a fixed magnetization direction, and
the second magnetic layer has a variable magnetization direction.

14. The memory device according to claim 8, wherein the non-magnetic layer includes oxygen and magnesium.

15. A memory device comprising:
a first interconnect above a substrate in a first direction, the first direction being perpendicular to a first face of the substrate;
a second interconnect between the substrate and the first interconnect; and
a memory cell between the first interconnect and the second interconnect, the memory cell including a switching element and a magnetoresistive effect element which are arranged along the first direction,
wherein the magnetoresistive effect element includes
a first electrode, a second electrode above the first electrode in the first direction, a first non-magnetic layer between the first electrode and the second electrode, a first magnetic layer between the first electrode and the first non-magnetic layer, a second magnetic layer between the second electrode and the first non-magnetic layer, a third magnetic layer between the first electrode and the first magnetic layer, and a second non-magnetic layer between the first magnetic layer and the third magnetic layer, and an electric resistance of the third magnetic layer is higher than an electric resistance of the first non-magnetic layer.

16. The memory device according to claim 15, wherein the first magnetic layer is a reference layer, the second magnetic layer is a storage layer, the third magnetic layer is a shift cancellation layer, and the first non-magnetic layer is a tunnel barrier layer.

17. The memory device according to claim 15, wherein the first magnetic layer has a fixed magnetization direction, and the second magnetic layer has a variable magnetization direction.

18. The memory device according to claim 17, wherein the third magnetic layer has a fixed magnetization direction.

\* \* \* \* \*